US008377774B2

(12) United States Patent
Nagai

(10) Patent No.: US 8,377,774 B2
(45) Date of Patent: Feb. 19, 2013

(54) SPLIT GATE TYPE NON-VOLATILE SEMICONDUCTOR MEMORY DEVICE AND METHOD OF MANUFACTURING THE SAME

(75) Inventor: Takaaki Nagai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/413,326

(22) Filed: Mar. 6, 2012

(65) Prior Publication Data

US 2012/0164823 A1   Jun. 28, 2012

Related U.S. Application Data

(63) Continuation of application No. 11/727,172, filed on Mar. 23, 2007, now abandoned.

(30) Foreign Application Priority Data

Mar. 24, 2006 (JP) ................................. 2006-083434

(51) Int. Cl.
*H01L 21/336* (2006.01)
(52) U.S. Cl. ........ 438/257; 438/157; 438/201; 438/283; 438/263; 438/264; 438/265; 438/593; 257/314; 257/315; 257/317; 257/E21.209; 257/E29.129; 257/E29.3
(58) Field of Classification Search .................. 438/157, 438/201, 257, 283, 263, 264, 265, 593; 257/314, 257/315, 317, E21.209, E29.129, E29.3
See application file for complete search history.

(56) References Cited

U.S. PATENT DOCUMENTS

| 6,090,668 | A | 7/2000 | Lin et al. |
|---|---|---|---|
| 6,441,429 | B1 | 8/2002 | Hsieh et al. |
| 6,525,371 | B2 | 2/2003 | Johnson et al. |
| 6,727,144 | B2 | 4/2004 | Hashimoto |
| 6,821,849 | B2 | 11/2004 | Chang et al. |
| 6,967,372 | B2 | 11/2005 | Chern |
| 2002/0146886 | A1 | 10/2002 | Chern |
| 2003/0155608 | A1 | 8/2003 | Cho et al. |
| 2005/0095785 | A1* | 5/2005 | Jeon et al. ...................... 438/257 |
| 2005/0176201 | A1* | 8/2005 | Liu et al. ....................... 438/257 |

FOREIGN PATENT DOCUMENTS

| JP | 2004-200181 A | 7/2004 |
|---|---|---|
| TW | 577173 | 2/2004 |

OTHER PUBLICATIONS

Office Action mailed Jan. 13, 2011 in Taiwanese Application No. 096110026.

* cited by examiner

*Primary Examiner* — Matthew E Warren
*Assistant Examiner* — David Chen
(74) *Attorney, Agent, or Firm* — Foley & Lardner LLP

(57) ABSTRACT

A split gate-type non-volatile semiconductor memory device includes a floating gate having an acute-angled portion between a side surface and an upper surface above a semiconductor substrate; a control gate provided apart from the floating gate to oppose to the acute-angled portion; and an insulating portion provided on the floating gate. A side surface of the insulating portion on a side of the control gate is inclined to a direction apart from the control gate with respect to a vertical line to the semiconductor substrate.

7 Claims, 22 Drawing Sheets

WRITE

ERASE

READ

US 8,377,774 B2

SPLIT GATE TYPE NON-VOLATILE SEMICONDUCTOR MEMORY DEVICE AND METHOD OF MANUFACTURING THE SAME

CROSS-REFERENCE TO RELATED PATENT APPLICATIONS

Japan Priority Application 2006-083434, filed Mar. 24, 2006 including the specification, drawings, claims and abstract, is incorporated herein by reference in its entirety. This application is a Continuation of U.S. application Ser. No. 11/727,172, filed Mar. 23, 2007, incorporated herein by reference in its entirety.

BACKGROUND OF THE INVENTION

1. Field of the Invention

The present invention relates to a non-volatile semiconductor memory device, and more particularly relates to a structure of a non-volatile memory referred to as a split gate type non-volatile semiconductor memory device, and a manufacturing method the same 2. Description of the Related Art As a non-volatile semiconductor memory device in which a storage content is not erased even if a power source is turned off, a split gate type non-volatile semiconductor memory device is known (for example, refer to U.S. Pat. No. 6,525,371B2 and Japanese Laid Open Patent Application (JP-P2004-200181A)). In recent years, a larger capacity of the non-volatile semiconductor memory device is strongly requested, and for this reason, it is essential to apply a finer pattern process to a memory element. Also, the smaller power consumption is strongly requested. For this reason, it is necessary to perform a write operation at a low voltage, an erasing operation at a low voltage and a read operation at a low current. In order to meet those requests, the respective electric characteristics of the plurality of memory elements are required to be uniform. For this purpose, the respective shapes of the memory elements are required to be configured uniformly and stably.

FIG. 1 is a sectional view showing the configuration of the split gate type non-volatile semiconductor memory device described in the U.S. Pat. No. 6,525,371B2 as a first conventional example). A non-volatile memory device 101 in the first conventional example has source diffusion layers 103 and drain diffusion layers 104. With reference to FIG. 1, the source diffusion layers 103 and the drain diffusion layers 104 are formed on a semiconductor substrate 102. As shown in FIG. 1, the split gate type non-volatile memory device 101 has floating gates 105 and control gates 106. The floating gate 105 is formed through a gate oxide film 107 on the substrate 102. Also, the control gate 106 is formed through a tunnel oxide film 108 on the substrate 102. Also, the tunnel oxide film 108 is formed between the floating gate 105 and the control gate 106.

Operations of the split gate type non-volatile memory device 101 in the first conventional example will be described below. FIGS. 2A to 2C are diagram showing the operations of the conventional split gate type non-volatile memory device 101. FIG. 2A shows a writing operation, FIG. 2B shows an erasing operation, and FIG. 2C shows a reading operation, in the split gate type non-volatile memory device 101. With reference to FIG. 2A, when a data is written to the split gate type non-volatile memory device 101, a voltage of the source diffusion layer 104 is set to be higher than that of the drain diffusion layer 103. Thus, hot electrons (electrons in a high energy state) are generated on a source side of a channel. The hot electrons are injected through the gate oxide film 107 into the floating gate 105, and thereby, the data is written. After the data is written, the floating gate becomes in a negatively electrified state.

With reference to FIG. 2B, when the data stored in the split gate type non-volatile memory device 101 is erased, the electrons are pulled out from the floating gate 105 to the control gate 106 through the tunnel oxide film 108 as a tunnel current, and the data is erased. In short, at the time of the erasure, a voltage is applied to the control gate 106, and a electric field is concentrated on a sharpened portion (an acute angle portion 110) of a tip portion of the floating gate 105, and the electrons are pulled out from the floating gate 105. After the erasure, the floating gate is in the positively electrified state.

With reference to FIG. 2C, when the data is read out from the split gate type non-volatile memory device 101, a predetermined voltage is applied to the control gate 106, and a transistor of the control gate 106, the source diffusion layer 103 and the drain diffusion layer 104 is activated. At this time, in response to the charges having injected in the floating gate 105, a value of the current flowing between the source diffusion layer 104 and the drain diffusion layer 103 is changed, thereby reading the data.

In this way, in the split gate type non-volatile memory device 101 having such a structure, the acute angle portion 110 of the floating gate 105 is required to be formed stably at a high precision. The technique for forming the acute angle portion 110 at the high precision is known, for example, in Japanese Laid Open Patent Application (JP-P2004-200181A: a second conventional example).

A method of manufacturing the split gate type non-volatile memory device 101 in the second conventional example will be described below. FIGS. 3A to 3I are cross sectional views showing the method of manufacturing the split gate type non-volatile memory device 101 in the second conventional example.

With reference to FIG. 3A, a gate oxide film 111 of 8 nm, a polysilicon film 112 of 80 nm and a silicon nitride film 113 of 300 nm are sequentially formed on the silicon substrate 102. Then, a photo resist layer 124 is formed on the silicon nitride film 113 as a pattern of floating gate and source formation regions.

Next, with reference to FIG. 3B, the silicon nitride film 113 is dry-etched by using the photo resist layer 124 as a mask, so that an opening is formed. Then, the resist is ashed.

Next, with reference to FIG. 3C, the opening of the silicon nitride film 113 is used as mask, and the polysilicon film 112 is etched to the depth of about 30 nm. Thus, a tapered portion having the angle of 45 degrees is generated.

Next, with reference to FIG. 3D, a thermal oxide film 114 of about 6 nm is formed at 850° C. on the surface of the polysilicon film 112.

Next, with reference to FIG. 3E, an LPCVD method is used to form a TEOS-NSG film of about 20 nm on the entire surface. Subsequently, when the TEOS-NSG film is etched by a dry etching apparatus of a RIE type, an NSG spacer 120 is formed to an extent that the tapered portion of the polysilicon film 112 is just concealed.

Next, with reference to FIG. 3F, an annealing process of about 850° C. is performed to anneal the TEOS-NSG film. Subsequently, an NSG film of about 160 nm is formed by the LPCVD method and then etched. Thus, an NSG spacer 115 is formed.

Next, with reference to FIG. 3G, an NSG spacer 116, a source diffusion region 117, a polysilicon plug 118 and a thermal oxide film 119 are formed. Subsequently, the silicon nitride film 113 is removed, for example, by using H3PO4 of 150° C.

Next, with reference to FIG. 3H, the NSG spacer 115, the NSG spacer 120 and the thermal oxide film 119 are used as masks, to dry-etch the polysilicon film 112. At this time, the acute angle portion 110 is formed.

Next, with reference to FIG. 3I, the NSG spacer 120 is removed, for example, by wet-etching of 5% fluorine acid for 40 seconds. Thus, the sharpened portion of the acute angle portion 110 is formed.

In the first and second conventional examples, cross sectional views are shown in which the acute angle portion 110 is formed. In this case, since the height of the control gate is defined on the basis of the height of the silicon nitride film 113, the silicon nitride film would be required to have the thickness of about 300 nm. It is technically very difficult to perform the dry etching on the thick silicon nitride film 113 stably and vertically to the substrate. FIGS. 4A to 4D are cross sectional views showing the manufacturing steps when the silicon nitride film 113 is not etched vertically to the substrate.

With reference to FIG. 4A, as mentioned above, the gate oxide film 111 of 8 nm, the polysilicon film 112 of 80 nm and the silicon nitride film 113 of 300 nm are sequentially formed on the silicon substrate 102. Then, the photo resist layer 124 is formed on the silicon nitride film 113 to have a pattern of the floating gate and source formation regions. Here, the resist mask 124 is formed at an interval of a first distance L1. The first distance L1 is a length corresponding to the floating gate length of the split gate type non-volatile memory device 101 that is desired to be finally formed.

Next, with reference to FIG. 4B, the photo resist layer 124 is used as a mask, and the silicon nitride film 113 is dry-etched to form an opening. Then, the resist is ashed. At this time, there is a case that the side wall of the silicon nitride film 113 that is formed through the etching is not formed in parallel to the normal line to the substrate 102 surface. At this time, the length of the exposed surface of the polysilicon film 112 would be become a second distance L2.

Next, with reference to FIG. 4C, the NSG spacer 115, the NSG spacer 120 and the thermal oxide film 119 are used as a mask, and the polysilicon film 112 is dry-etched. As a result, the floating gate having the acute angle portion 110 is formed. In this case, when the side wall of the opening of the silicon nitride film 113 is inclined, there is a case that correspondingly to the inclination, the side wall of the NSG spacer 120 is also inclined outside the NSG spacer 120. Thus, there is a case that the etching is performed at a fourth distance L4 from the end of the floating gate 105 on the drain side so that a step 112 of the polysilicon film is formed.

Next, with reference to FIG. 4D, through the above steps, the acute angle portion 110 is improperly formed in the split gate type non-volatile memory device 101. As mentioned above, the silicon nitride film 113 is required to be formed at the thickness of about 300 nm. In this case, it is technically very difficult to stably etch the silicon nitride film 113 vertically to the substrate surface. For example, there is a case that reactive product at the time of the etching is deposited on the nitride film side, which disturbs the etching. In this case, as the etching is advanced to a lower portion, the wall of the opening is inclined to a direction that the opening width becomes narrower. Thus, when the conventional technique is used to form the floating gate 105 having the acute angle portion 110, there is a case that because of the variation in the inclination angle of the silicon nitride film 113, the actual acute angle portion 110 cannot be formed in the ideal shape.

As mentioned above, in the conventional split gate type non-volatile memory, the charges stored in the floating gate 105 are pulled out through the acute angle portion 110 into the control gate 106, and the data is consequently erased. When the acute angle portion 110 of the floating gate 105 is properly formed, the electric field can be concentrated on the acute angle portion 110. Thus, the electrons can be properly pulled out from the floating gate 105. However, when the side wall of the opening of the silicon nitride film 113 is inclined, there is a case that the actual acute angle portion 110 cannot be formed in the ideal shape. If the variation in the shape of the acute angle portion 110 is larger, the variation in the erasure property becomes also greater. As a result, the normal and stable operation of the split gate type non-volatile memory cannot be achieved.

SUMMARY OF THE INVENTION

In an aspect of the present invention, a split gate-type non-volatile semiconductor memory device includes a floating gate having an acute-angled portion between a side surface and an upper surface above a semiconductor substrate; a control gate provided apart from the floating gate to oppose to the acute-angled portion; and an insulating portion provided on the floating gate. A side surface of the insulating portion on a side of the control gate is inclined to a direction apart from the control gate with respect to a vertical line to the semiconductor substrate.

The side surface of the insulating portion may be terminated at the acute-angled portion.

Also, the insulating portion may be formed on the floating gate, and the side surface of the insulating portion on the side of the control gate may be opposite to a side surface of the control gate through an insulating film.

In another aspect of the present invention, a method of manufacturing a split gate-type non volatile semiconductor memory device having a floating gate and a control gate, is achieved by forming a polysilicon film on a semiconductor substrate through a first insulating film; by patterning the polysilicon film by using a mask insulating film as a mask such that the polysilicon film is etched based on a shape of a lower portion of the mask insulating film which is formed on the polysilicon film, wherein the mask insulating film has a side surface inclined in a direction apart from the control gate; and by forming the control gate on the substrate through the second insulating film to oppose to the floating gate through the second insulating film.

Here, the patterning may be achieved by forming a third insulating film on the polysilicon film; by removing a part of the third insulating film to form a first opening; by filling the first opening with a fourth insulating film; by removing the third insulating film to form a second opening; by forming a fifth insulating film in the second opening and on the fourth insulating film; and by etching back the fifth insulating film to form the mask insulating films.

In this case, the patterning may be achieved by further removing a part of the polysilicon film between a first adjacent two of the mask insulating films; forming a source diffusion layer in the substrate between the first adjacent two of the mask insulating films; forming side wall insulating films on side walls of the polysilicon film; and forming a source line connected with the source diffusion layer between the first adjacent two of the mask insulating films.

Also, the patterning may be achieved by further removing the fourth insulating film to form a third opening; and etching the polysilicon film by using a second adjacent two of the mask insulating films as a mask to form the floating gates.

Also, the forming the control gate may be achieved by exposing a surface of the semiconductor substrate in the third opening; by forming the second insulating film to cover the exposed surface of the semiconductor substrate, the floating gates and the mask insulating films; and by forming the control gate on the second insulating film to oppose to the floating gate.

Also, the removing a part of the third insulating film may be achieved by forming the first opening to expose a surface of the polysilicon film.

Also, the forming the first opening may be achieved by forming the first opening such that the first opening have a dull angle at a corner between a side wall of the third insulating film and the surface of the polysilicon film.

Also, the forming the first opening may be achieved by etching the polysilicon film in the first opening.

Also, the exposing a surface of the semiconductor substrate in the third opening may be achieved by removing the first insulating film between the first adjacent two of the mask insulating films.

In still another aspect of the present invention, a split gate type non-volatile semiconductor memory device includes a floating gate provided on a semiconductor substrate through a first insulating film; and a control gate provided to cover a portion of the floating gate through a second insulating film. The control gate has a side surface on a side of the floating gate, and the side surface of the control gate is inclined in a direction of the floating gate.

Here, the split gate type non-volatile semiconductor memory device may further include a spacer insulating film formed on the floating gate to oppose to the side surface through the second insulating film.

According to the present invention, in the split gate type non-volatile memory where the data erasure is executed by pulling out the electrons from the floating gate to the control gate, it is possible to configure the non-volatile memory where the operation of the data erasure can be executed properly and stably.

BRIEF DESCRIPTION OF THE DRAWINGS

FIGS. 3A to 3I are cross sectional views showing a method of manufacturing the conventional split gate type non-volatile memory device;

DESCRIPTION OF THE PREFERRED EMBODIMENTS

Hereinafter, a split gate type non-volatile semiconductor memory device according to the present invention will be described in detail with reference to the attached drawings.

Figure 5:
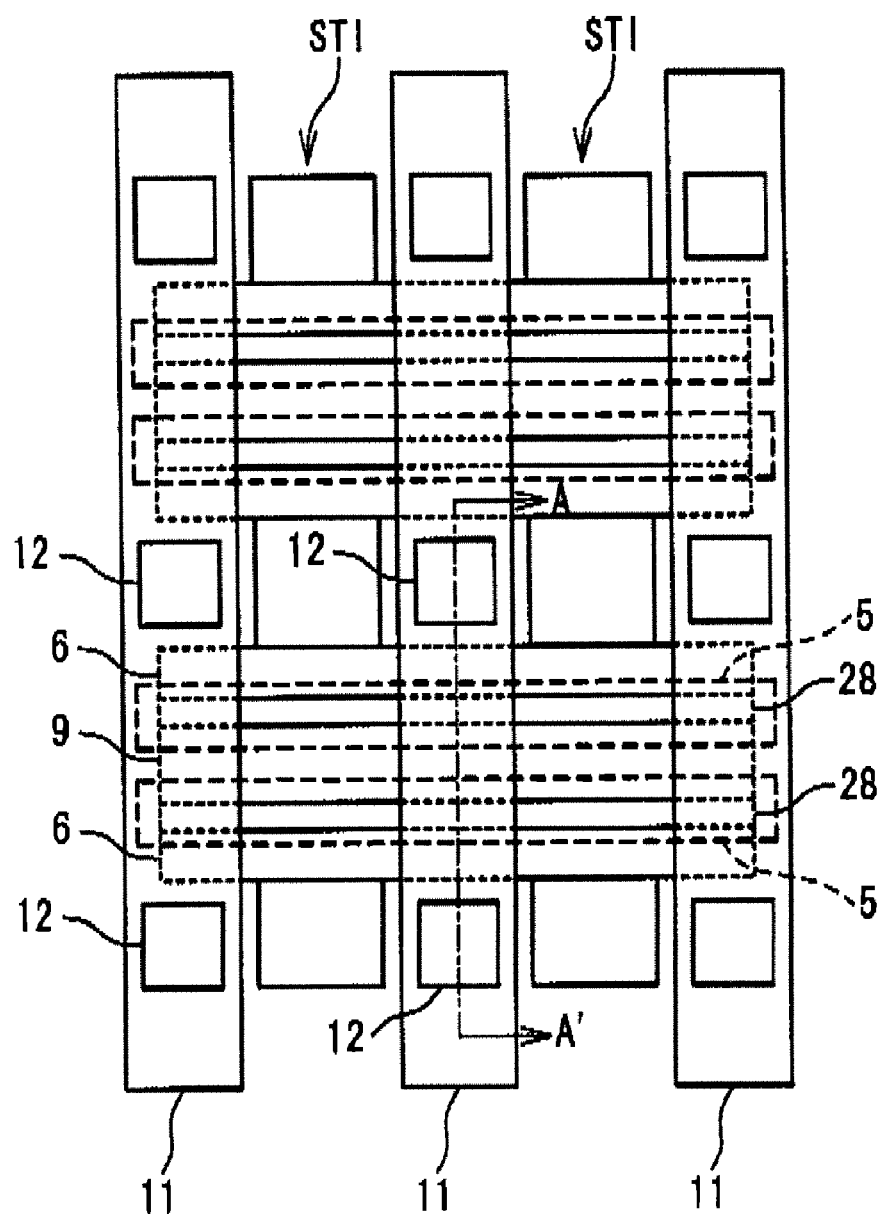
FIG. 5 is a plan view showing the configuration of a part of a split gate type non-volatile memory device according to an embodiment of the present invention.

FIG. 5 is a plan view showing the configuration of a part of a split gate type non-volatile memory device according to an embodiment of the present invention. With reference to FIG. 5, the split gate type non-volatile memory device in this embodiment is provided with bit lines 11 extending in a first direction, and control gates 6 extending in a direction orthogonal to the bit lines 11. Also, the split gate type non-volatile memory device in this embodiment has source lines 9 extending in a direction orthogonal to the bit lines 11 in parallel to the control gates 6. The control gates 6 and the source lines 9 are formed in the layers lower than the bit lines 11. Also, the control gate 6 and the source line 9 are electrically insulated by a spacer 28. In this way, the element separation that uses an STI structure is performed in the split gate type non-volatile memory device in this embodiment. Also, the bit line 11 is connected through a bit contact 12 to a drain diffusion layer 4 formed on the semiconductor substrate (not shown).

Figure 6:
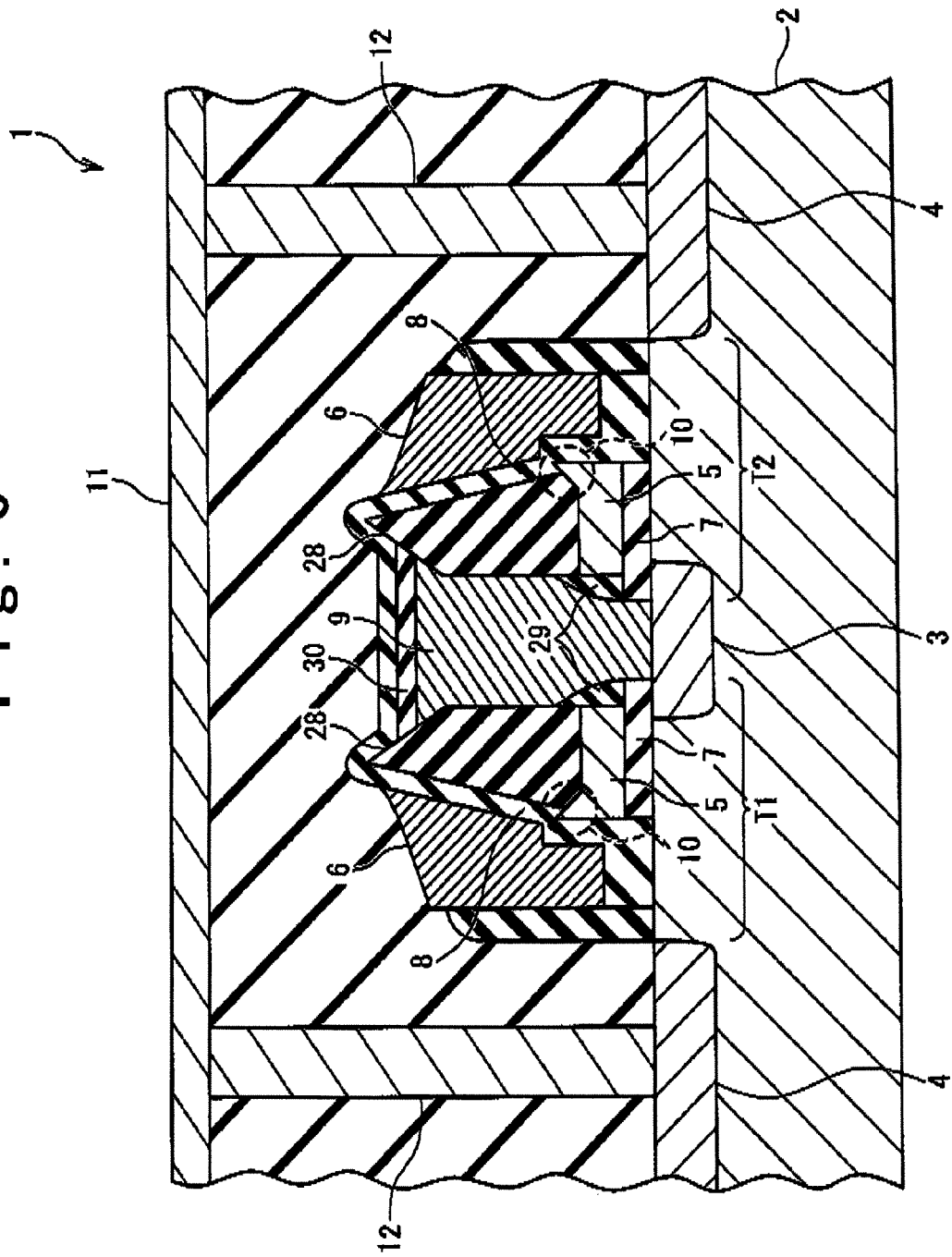
FIG. 6 is a cross sectional view showing the split gate type non-volatile memory device according to the embodiment of the present invention along the line A-A' in FIG. 5.

FIG. 6 is a cross sectional view showing a section of the split gate type non-volatile memory device along the line A-A' in FIG. 5. FIG. 6 shows an example of the section where the structure of a memory cell 1 of the split gate type non-volatile memory device is simplified in order to easily understand the present invention. As shown in FIG. 6, in the memory cell 1 of the split gate type non-volatile memory device in this embodiment, two transistors T1 and T2 are symmetrically fainted. The memory cell 1 of the split gate type non-volatile memory device in this embodiment has a source diffusion layer 3 in common to the two transistor and the drain diffusion layers 4 that are formed on a substrate 2 for the two transistors. It should be noted that the following embodiment will be described under assumption that the substrate 2 is a P-type semiconductor substrate. This does not imply that in the present invention, the substrate 2 is limited to the P-type semiconductor substrate.

The substrate 2 is formed to have a channel region between the source diffusion layer 3 and the drain diffusion layer 4. Also, the memory cell 1 of the split gate type non-volatile memory device is formed to have floating gates 5 and the control gates 6. The floating gate 5 is formed on the substrate 2 through a gate oxide film 7. Also, the control gate 6 is formed on the substrate 2 through a tunnel oxide film 8 acting as a gate insulating film. The floating gate 5 and the control gate 6 are formed to be adjacent to each other through the tunnel oxide film 8. A spacer insulating film 28 is formed on the floating gate 5. Also, the source line 9 is formed on the source diffusion layer 3. The source line 9 and the floating gate 5 are electrically insulated by a side wall insulating film 29. Thus, the floating gate 5 is electrically insulated from the other conductive portion, by the gate oxide film 7, the tunnel oxide film 8, the spacer insulating film 28 and the side wall insulating film 29.

Next, with reference to FIG. 6, the floating gate 5 in this embodiment is formed to have an acute angle portion 10. Also, the spacer insulating film 28 is formed while being inclined to the direction of the source line 9. The memory cell 1 of the split gate type non-volatile memory device in this embodiment is manufactured by using a self alignment technique. For example, when the floating gate 5 is formed, the spacer insulating film 28 is used as a mask. Since the spacer insulating film 28 is inclined to the direction of the source line 9, the acute angle portion 10 of the floating gate 5 is formed such that the data erasure operation can be performed stably at a high precision.

Figure 7A:
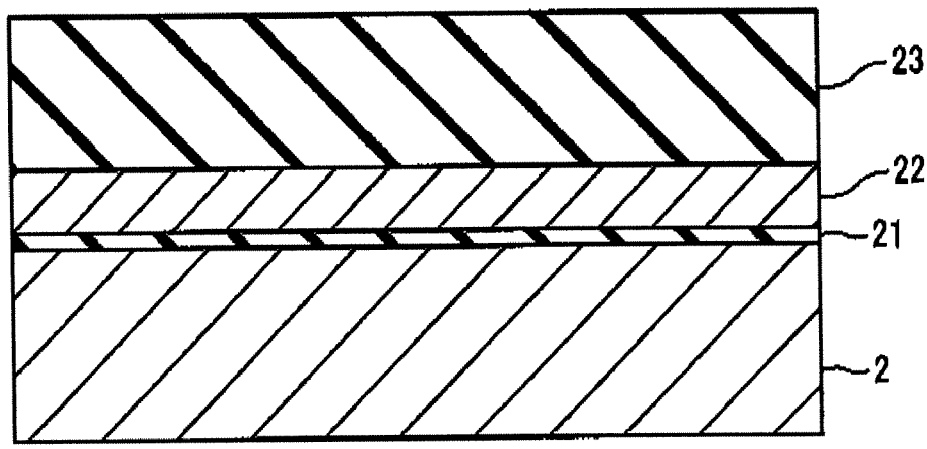
FIGS. 7A to 7R are sectional views showing a manufacturing method of memory cells of a split gate type non-volatile memory device according to the embodiment of the present invention.

A manufacturing method of manufacturing the memory cell 1 of the split gate type non-volatile memory device in this embodiment will be described below with reference to the drawings. FIGS. 7A to 7R are sectional views showing the memory cells 1 in a manufacturing method of the split gate type non-volatile memory device in this embodiment.

With reference to FIG. 7A, an initial insulating film 21 of about 80 to 100 nm is formed on the semiconductor substrate 2 by using a thermally oxidizing method. The initial insulating film 21 finally functions as the gate oxide film 7 for insulating the floating gate 5 and the substrate 2 in the memory cell 1 of the split gate type non-volatile memory device. After the formation of the initial insulating film 21, a polysilicon film 22 of about 80 to 100 nm is formed on the insulating film 21. The polysilicon film 22 finally functions as the floating gate 5. In the manufacturing method of the memory cell 1 of the split gate type non-volatile memory device described in this embodiment, an oxide film 23 of about 300 nm is formed on the polysilicon film 22, unlike the conventional manufacturing method.

Figure 7B:
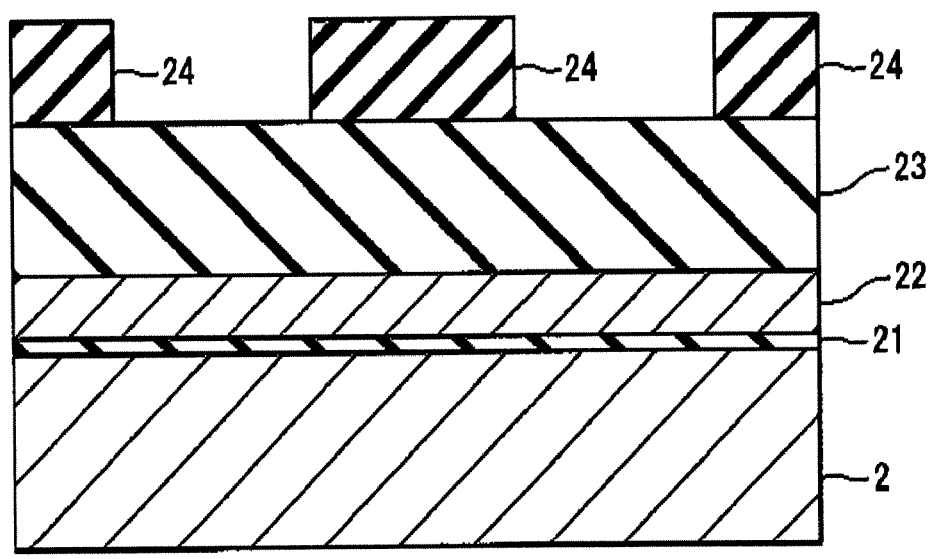

Next, with reference to FIG. 7B, a resist mask 24 is formed on the oxide film 23 to have a pattern. In this embodiment, the resist mask 24 is patterned by using a pre-manufactured photo mask.

Figure 7C:
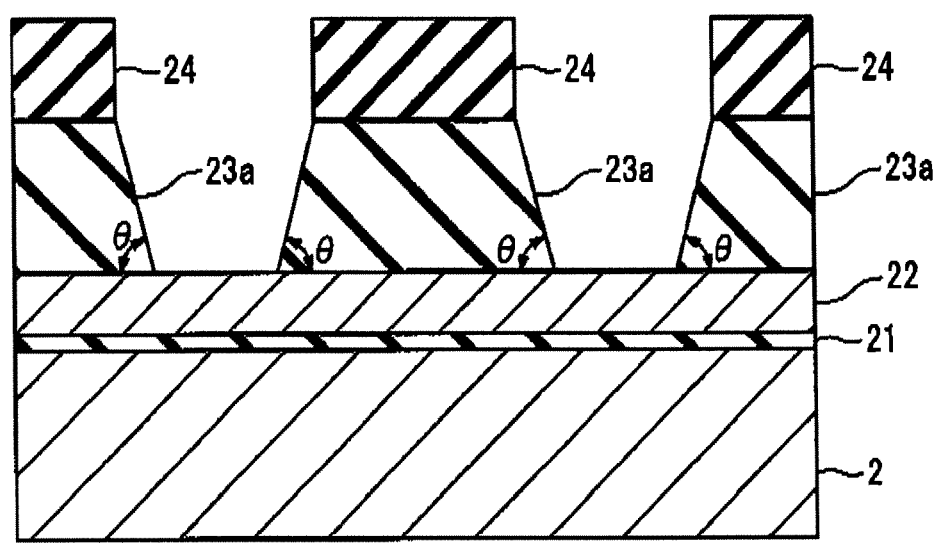

Next, with reference to FIG. 7C, the resist mask 24 is used as a mask, and the oxide film 23 is etched by a dry etching method. Through the etching of the oxide film 23, first oxide films 23a are formed. The side wall of the first oxide film 23a is not formed in a direction vertical to the substrate 2 surface, and it is formed to have the wider inclined portion than the low region of the resist mask 24. In short, the opening becomes narrower in a deeper portion. It is preferable that the first oxide film 23a is not etched to the direction that the opening is narrower in a deeper portion. Specifically, the inclination angle θ is preferable to be about 85 degrees.

Figure 7D:
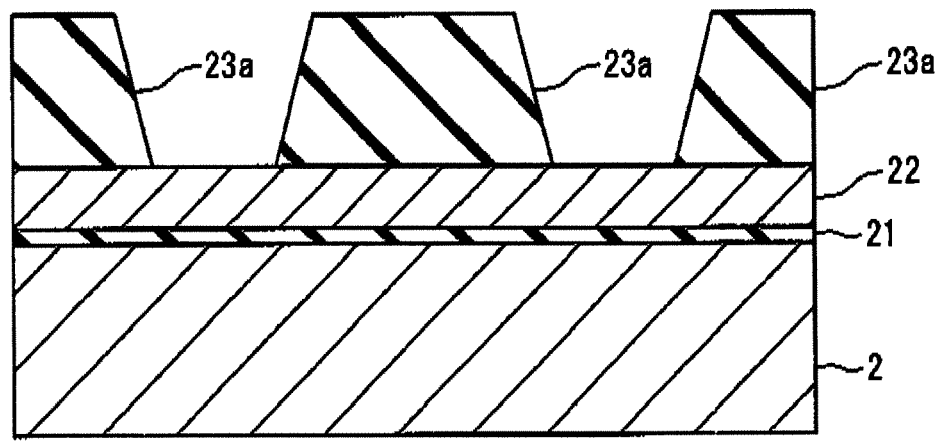
Figure 7E:
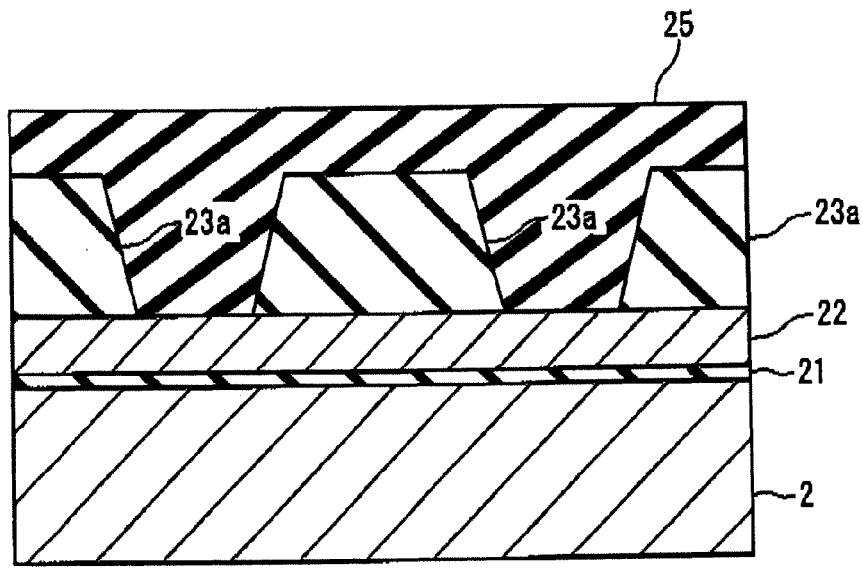

Next, with reference to FIG. 7D, the resist mask 24 is removed. After that, as shown in FIG. 7E, a nitride film 25 of about 500 to 600 nm is formed to cover the first oxide films 23a and the exposed polysilicon film 22.

Figure 7F:
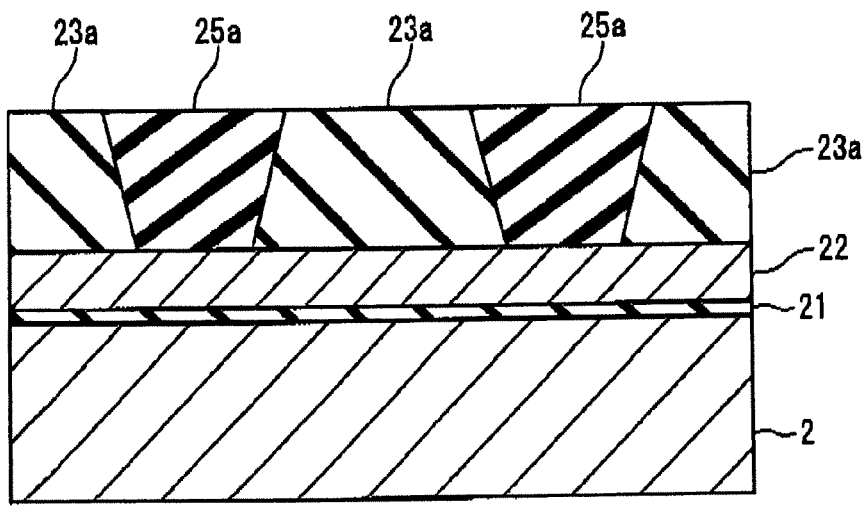

Next with reference to FIG. 7F, the surface of the laminated nitride film 25 is made flat by using the technique of CMP (Chemical Mechanical Polishing), etch-back by the dry etching method, and the like. Thus, first nitride films 25a are formed.

Figure 7G:
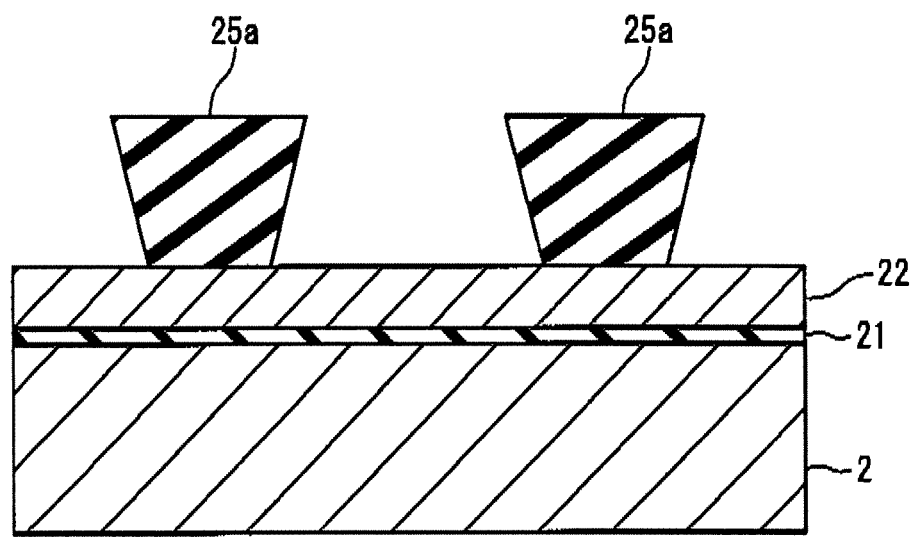

Next, with reference to FIG. 7G, the first oxide films 23a are removed through an etching process. Thus, the surface of the polysilicon film 22 formed in the lower layer of the first oxide film 23a is exposed.

Figure 7H:
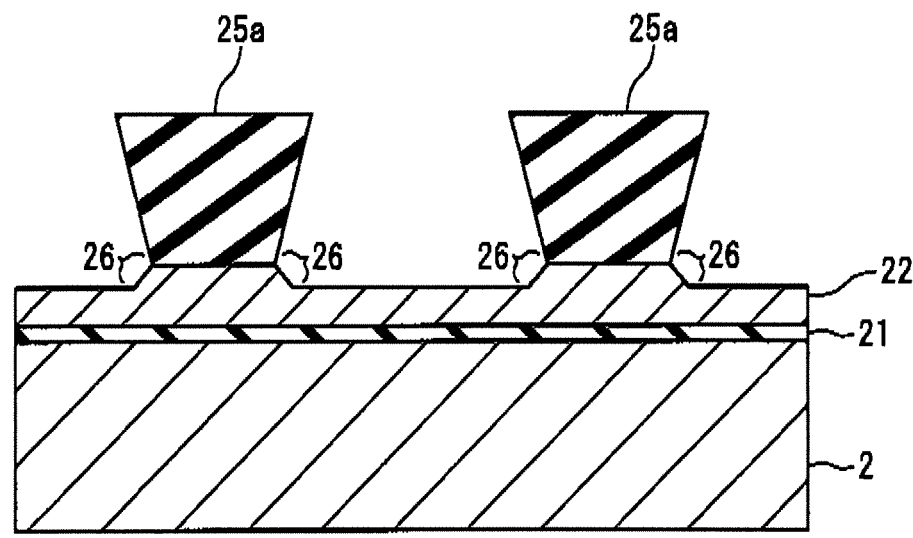

Next, with reference to FIG. 7H, the surface of the exposed polysilicon film 22 is etched to form inclination portions 26. The inclination portion 26 formed at this step finally functions as the acute angle portion 10.

Figure 7I:
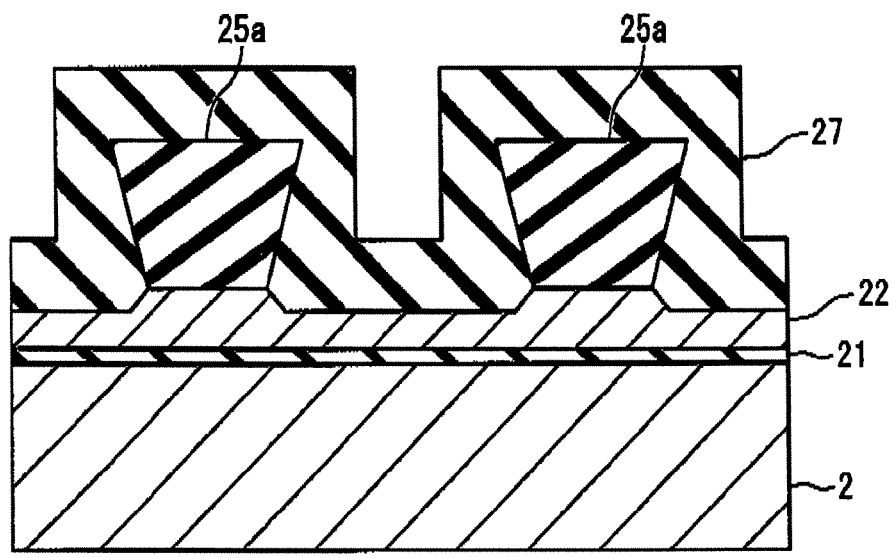

Next, with reference to FIG. 7I, a second oxide film 27 of about 200 nm is formed to cover the first nitride films 25a and the polysilicon film 22 having the inclination portions 26.

Figure 7J:
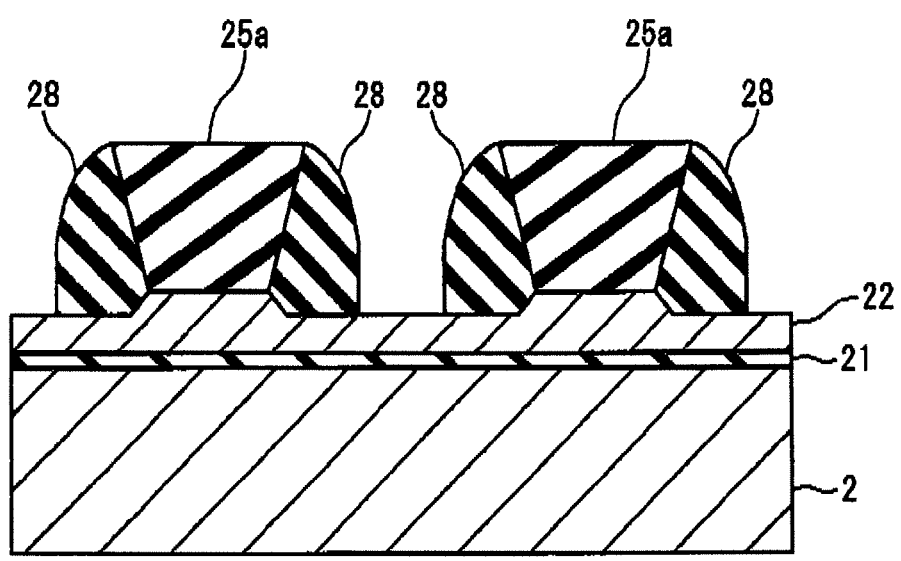

Next, with reference to FIG. 7J, the second oxide film 27 is etched back. Since the second oxide film 27 is etched back, the side walls (hereafter, referred to as the spacer insulating film 28) are formed on the both side of the first nitride film 25a. Also, since the second oxide film 27 is etched, the polysilicon film 22 is exposed in a region other than the region in which the spacers 28 are formed.

Figure 7K:
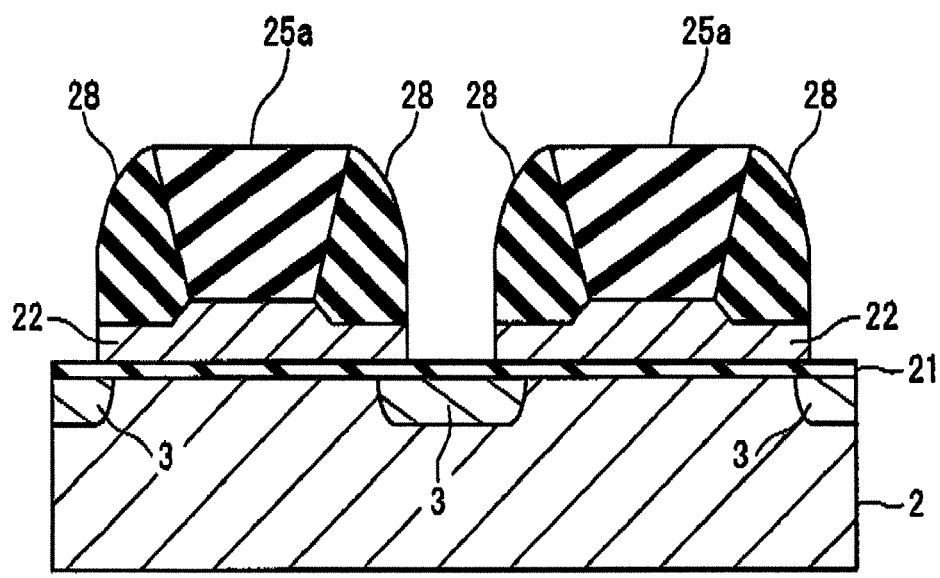

Next, with reference to FIG. 7K, the spacers 28 and the first nitride films 25a are used as a mask, and the polysilicon film 22 is etched in the self alignment. Through this etching step, the polysilicon film 22 is removed that is not covered by the spacer insulating film 28 and the first nitride film 25a. As a result, the initial insulating film 21 formed under the removed polysilicon film 22 is exposed. In the memory cell 1 of the split gate type non-volatile memory device in this embodiment, the spacers 28 and the first nitride films 25a are used as a mask, and the impurity (for example, N-type impurity such as arsenic and phosphorus) is implanted into the substrate 2, and the source diffusion layer 3 is formed.

Figure 7L:
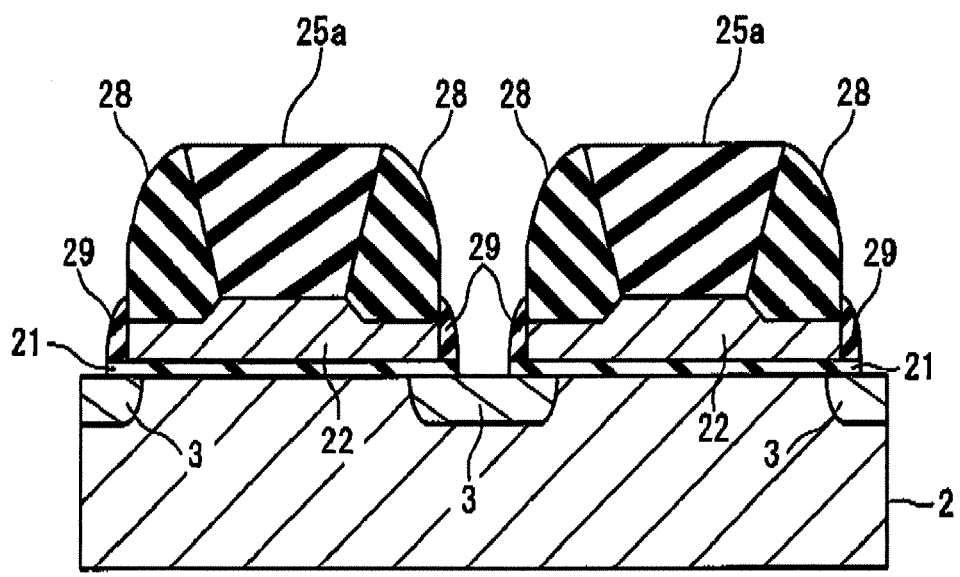

Next, with reference to FIG. 7L, after an oxide film is formed on the entire surface, the etch-back is performed, and the side wall insulating films 29 are consequently formed on the side of the polysilicon film 22. Then, the side wall insulating film 29 is used as a mask, and the initial insulating film 21 is etched. Through this step, the source diffusion layer 3 formed in the substrate 2 is exposed.

Figure 7M:
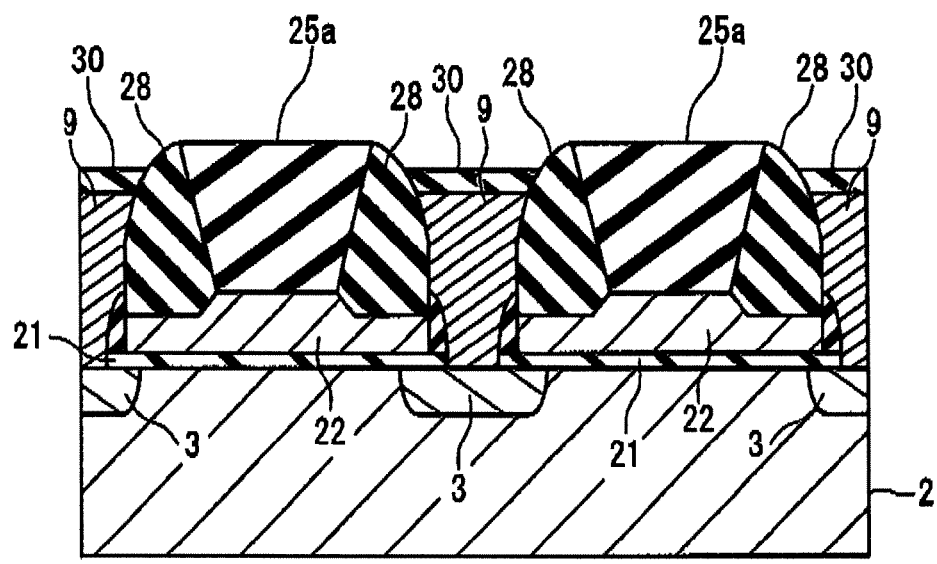

Next, with reference to FIG. 7M, the source line 9 is formed on the source diffusion layer 3, similarly to the conventional examples. After the formation of the source line 9, an oxide film 30 is formed on the source line 9 through thermal oxidation.

Figure 7N:
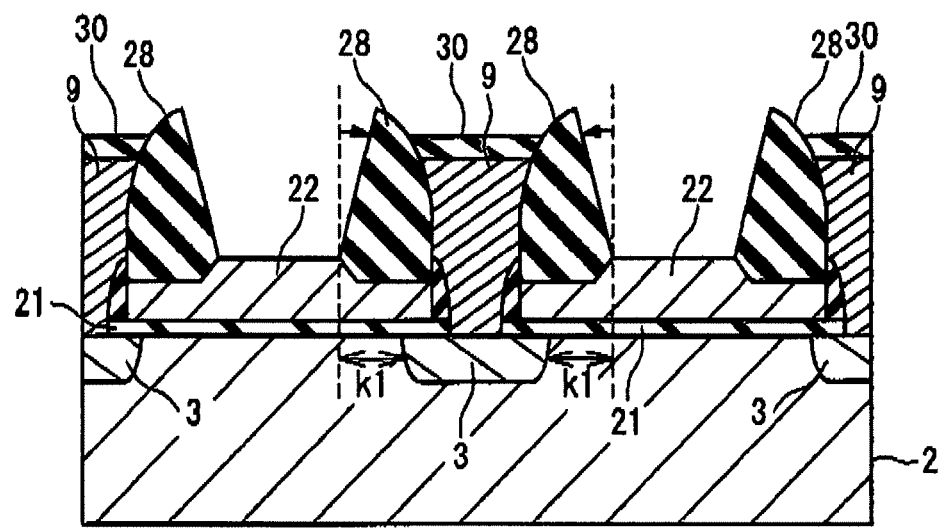

After that, as shown in FIG. 7N, the first nitride films 25a are removed. Through this step, the surface of the polysilicon film 22 having formed below the first nitride film 25a is exposed. The upper portion of the spacer insulating film 28 formed in the above step is inclined to the side of the source diffusion layer 3 from the vertical direction. The inclination portion 26 of the spacer insulating film 28 is positioned in the distance k1 from the end of the source diffusion layer 3.

Figure 7O:
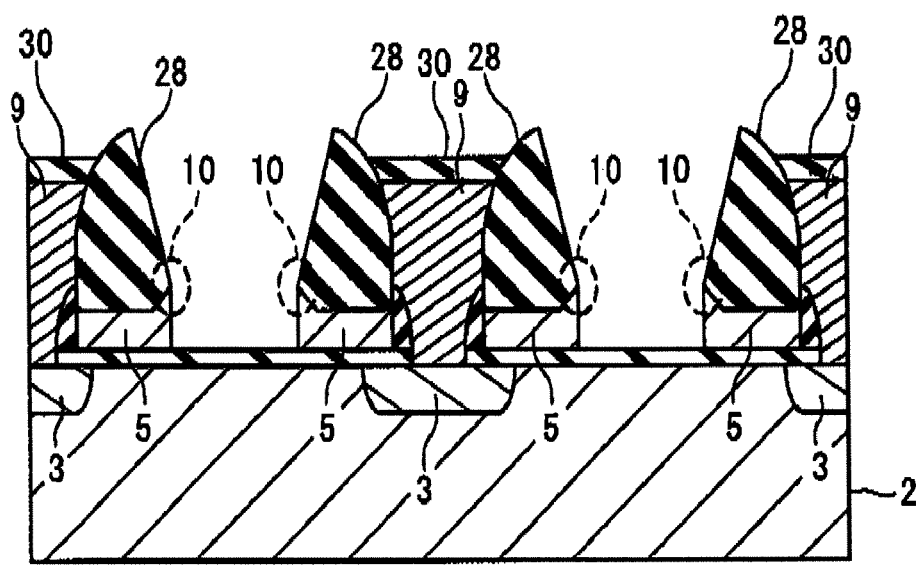

Next, with reference to FIG. 7O, the spacer insulating film 28 is used as a mask, and the exposed portions of the polysilicon film 22 etched. Through the etching of the polysilicon film 22, the floating gate 5 is formed. As mentioned above, the spacer insulating film 28 is inclined to the side of the source diffusion layer 3. For this reason, the spacer insulating film 28 does not have any overlapping portion with the film 22 in the vertical direction to the surface of the exposed polysilicon film 22. When the floating gate 5 is formed in the self alignment with the spacer insulating film 28 as the mask, the proper acute angle portion 10 can be stably formed.

Figure 7P:
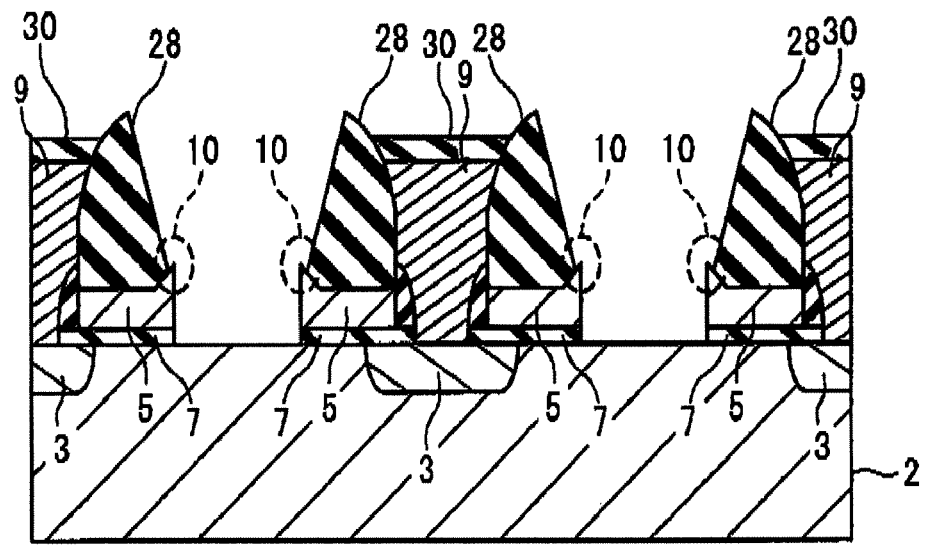

Next, with reference to FIG. 7P, the spacer insulating film 28 is used as a mask, and the exposed initial insulating film 21 is removed by a wet etching of hydrofluoric acid. Through this step, the surface of the substrate 2 is exposed. Also, since the exposed portion of the initial insulating film 21 is removed, the initial insulating film 21 remains under the floating gate 5, and the initial insulating film 21 is formed as the gate oxide film 7. Also, at this time, a part of the spacer insulating film 28 is moved back to the direction of the source diffusion layer 3.

Figure 7Q:
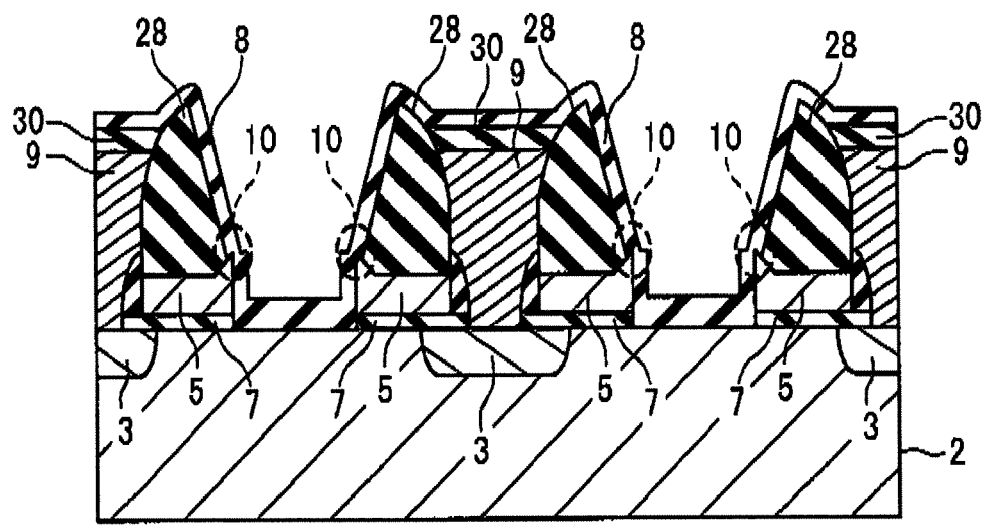
Figure 7R:
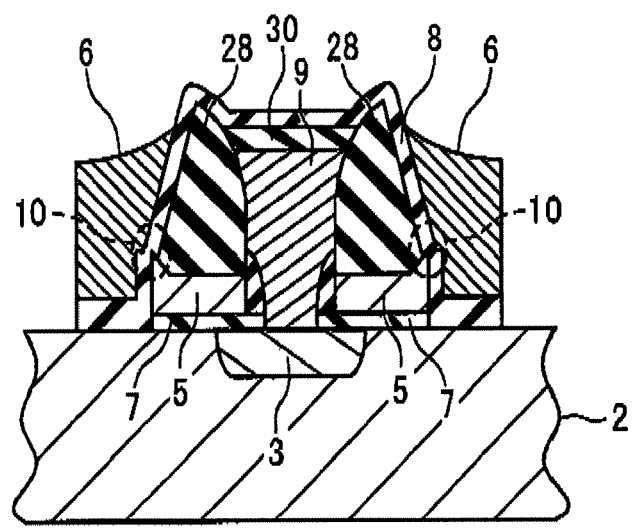

Next, with reference to FIG. 7Q, a tunnel oxide film 8 of about 16 nm is formed to cover the exposed substrate 2, a side and upper portion of the floating gate 5, the side of the spacer insulating film 28, and the source line 9.

Next, with reference to FIG. 7R, the polysilicon film is formed on the tunnel oxide film 8. The polysilicon film is etched to forming the polysilicon film (hereafter, referred to as a control gate 6) of a side wall shape. The control gate 6 is formed to be adjacent to the floating gate 5 through the tunnel oxide film 8. The control gate 6 is formed to cover the acute angle portion 10 of the floating gate 5. Due to this acute angle portion 10, the operation of the data erasure can be properly performed. After that, as mentioned above, a side wall insulating film is formed on the side wall of the control gate 6. The side wall insulating films are used as a mask, and a drain diffusion layer 4 is formed on the substrate 2 in the self alignment.

Since the memory cell 1 of the split gate type non-volatile memory device is manufactured through the above steps, the memory cell 1 can be formed as shown in FIG. 6. In the conventional split gate type non-volatile memory device cell 101, the thick nitride film has been dry-etched, to remove the upper layer portion of the floating gate 5. Moreover, the oxide film has been formed on the opened portion, to form the spacers 128. In this case, it was difficult to stably form the side wall insulating films of the opened portion vertically to the substrate. Also, there was a case that the side wall portion is inclined due to the variation in the manufacture. Since the inclination of the side wall portion varies, the acute angle portion 10 of the floating gate 5 cannot stably formed. As a result, the erasure operation was not stable. Also, this caused the variation in the gate length of the floating gate 5, and brought about the problem that the writing and reading operations were not stable.

Figure 1:
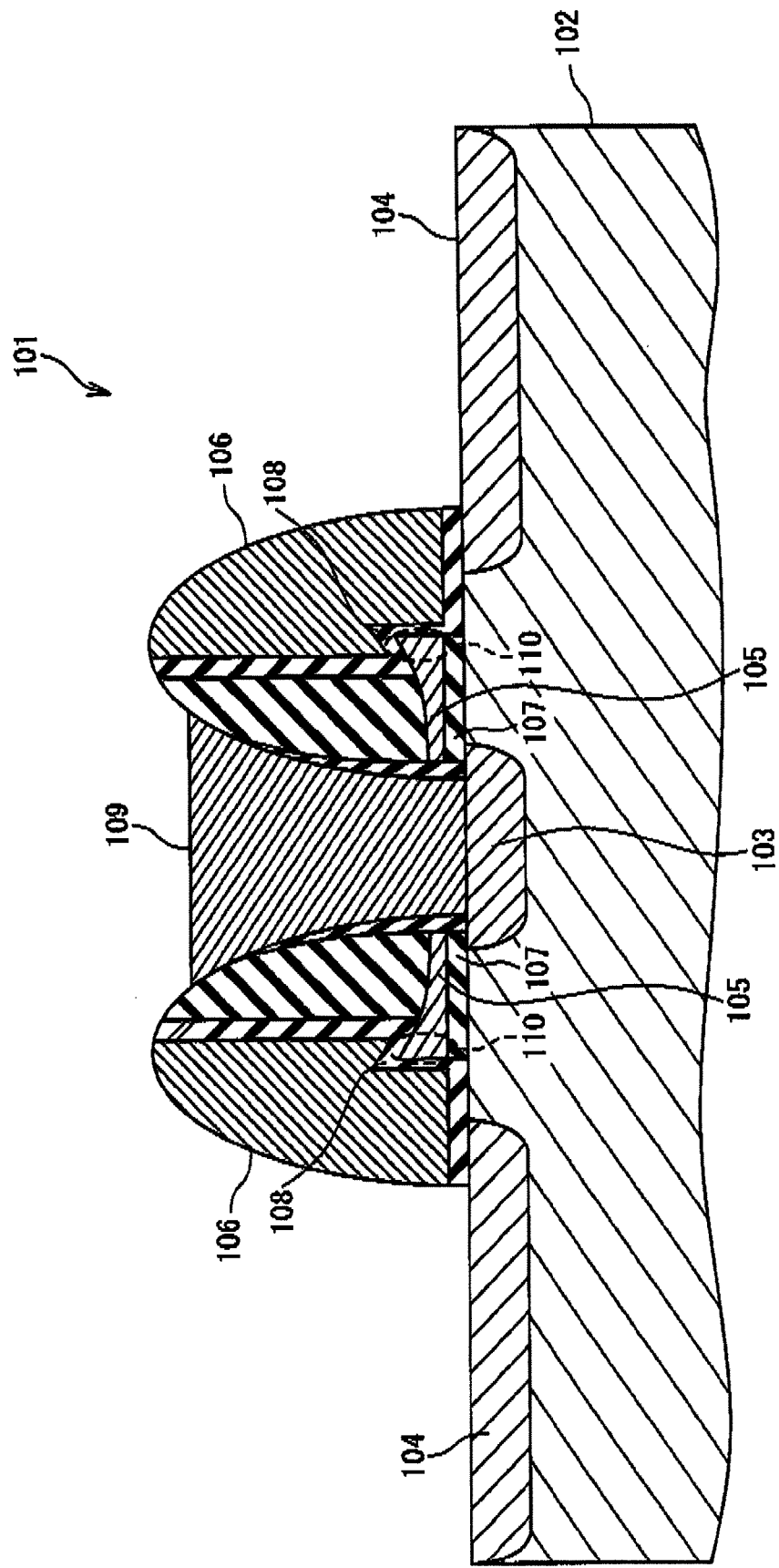
FIG. 1 is a sectional view showing the configuration of a conventional split gate type non-volatile memory.
Figure 2A:
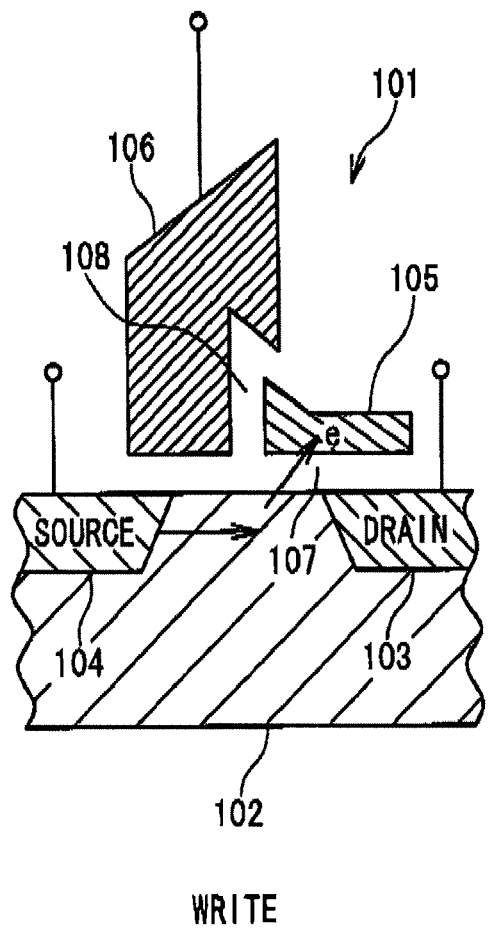
FIGS. 2A to 2C are diagrams showing operations of the conventional split gate type non-volatile memory.
Figure 2B:
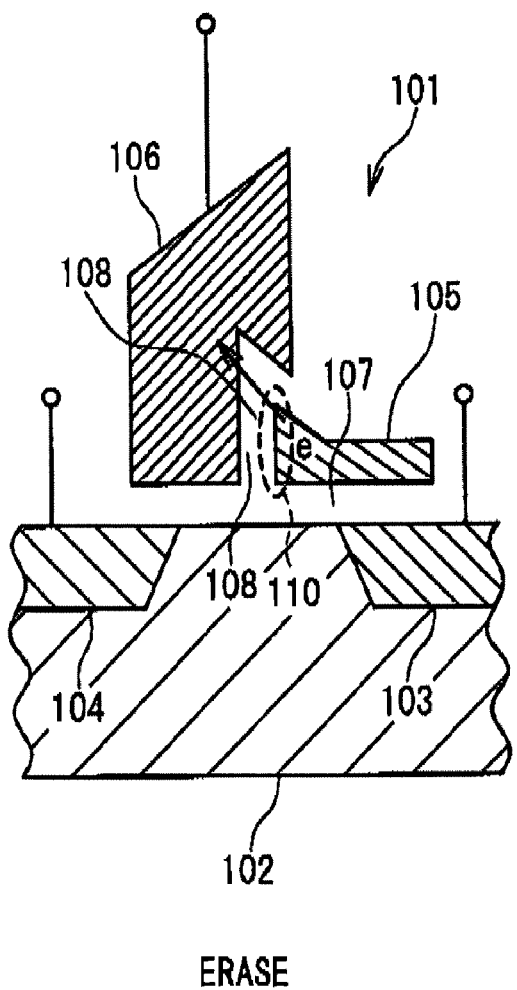
Figure 2C:
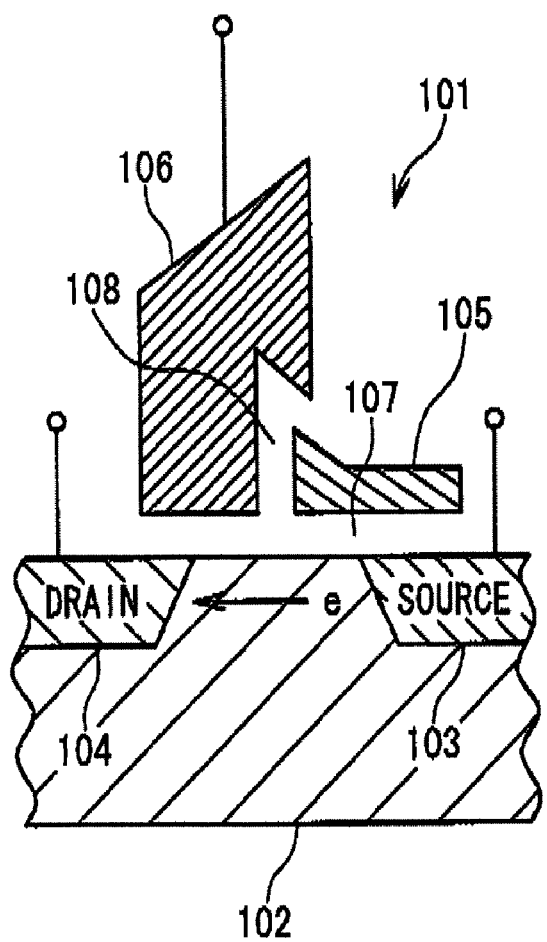
Figure 3A:
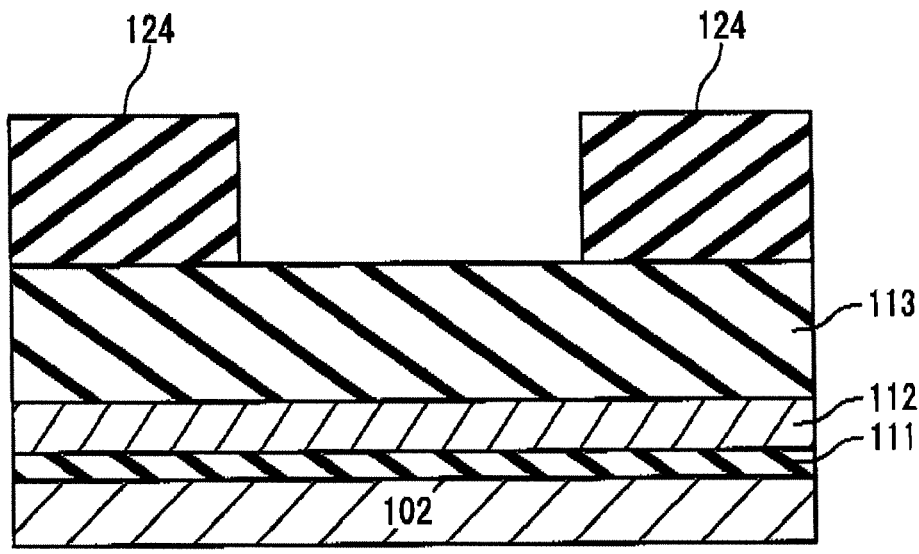
Figure 3B:
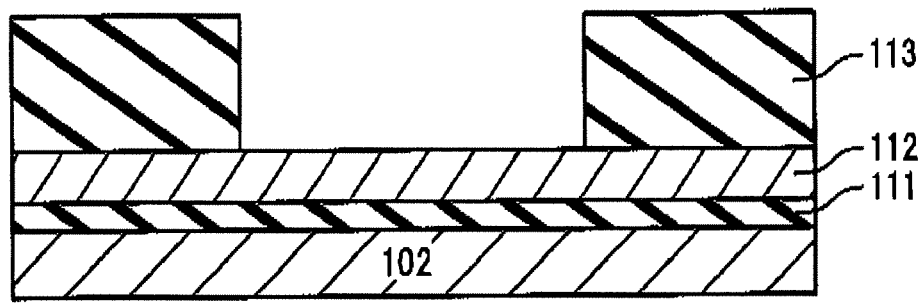
Figure 3C:
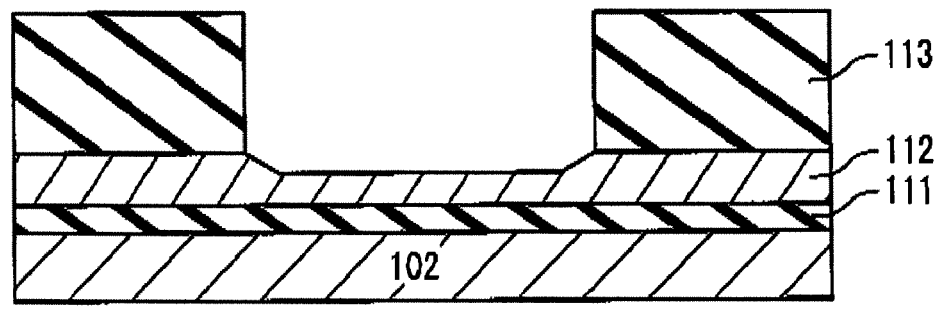
Figure 3D:
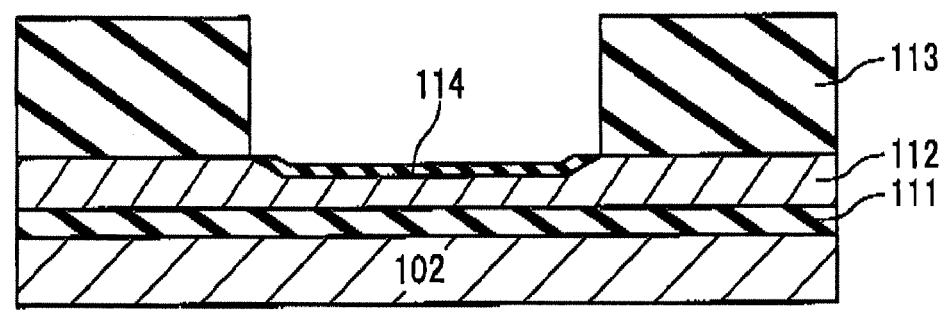
Figure 3E:
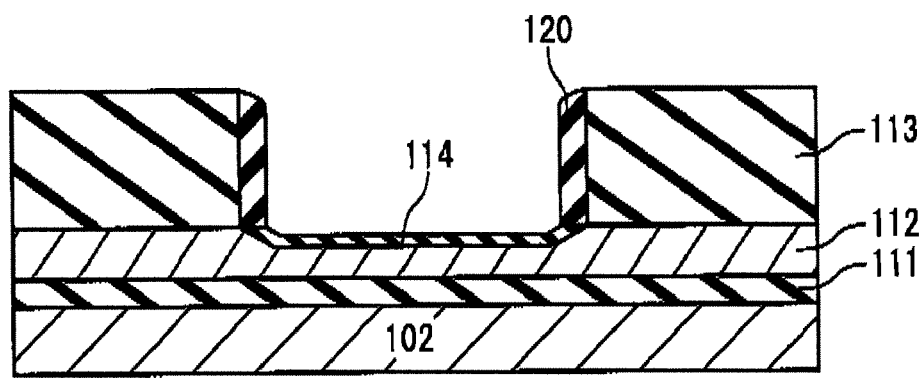
Figure 3F:
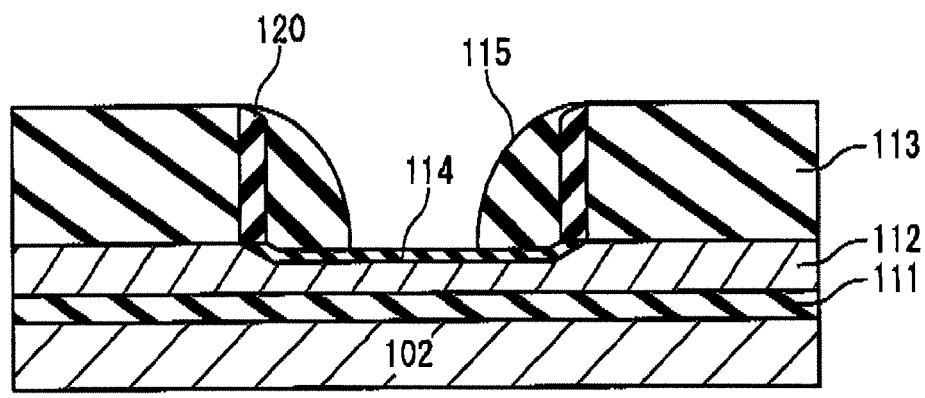
Figure 3G:
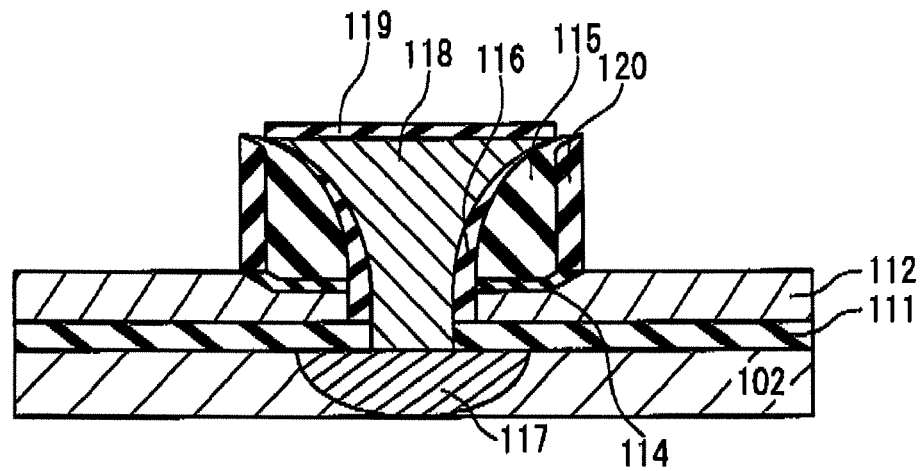
Figure 3H:
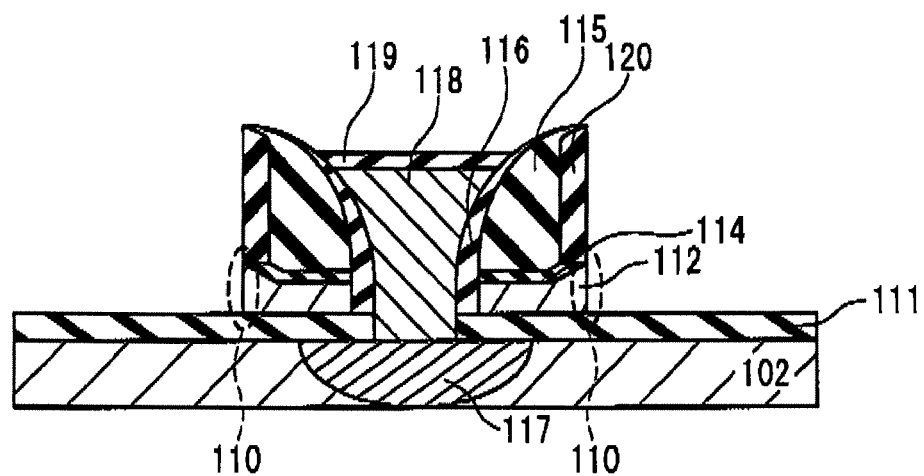
Figure 31:
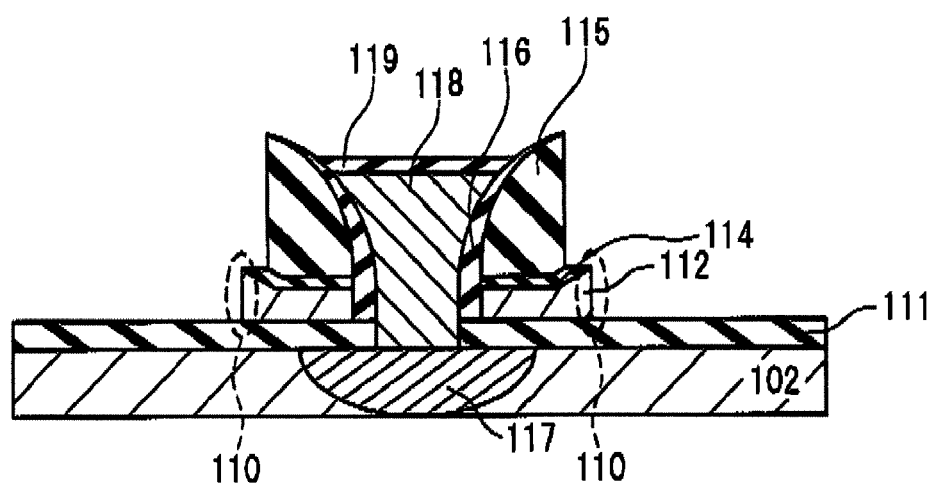
Figure 4A:
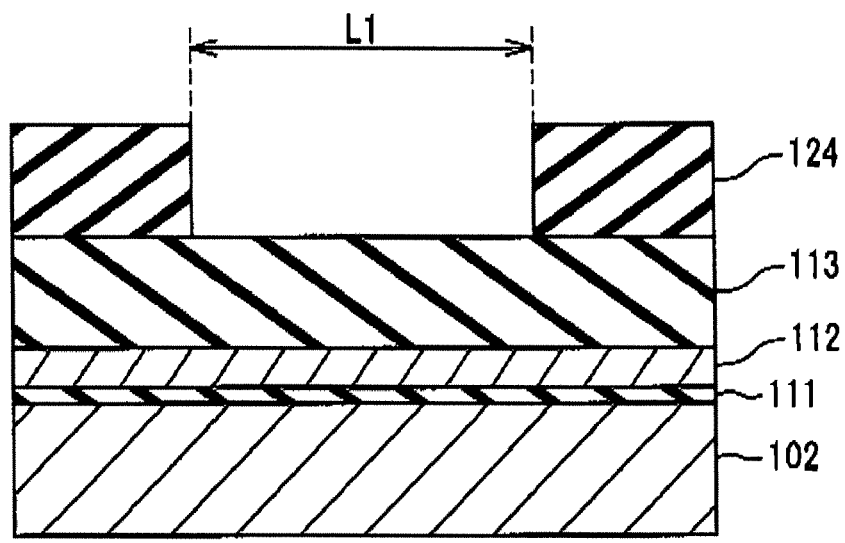
FIGS. 4A to 4D are cross sectional views showing a manufacturing steps when a silicon nitride film is not etched vertically to a substrate in the conventional split gate type non-volatile memory device.
Figure 4B:
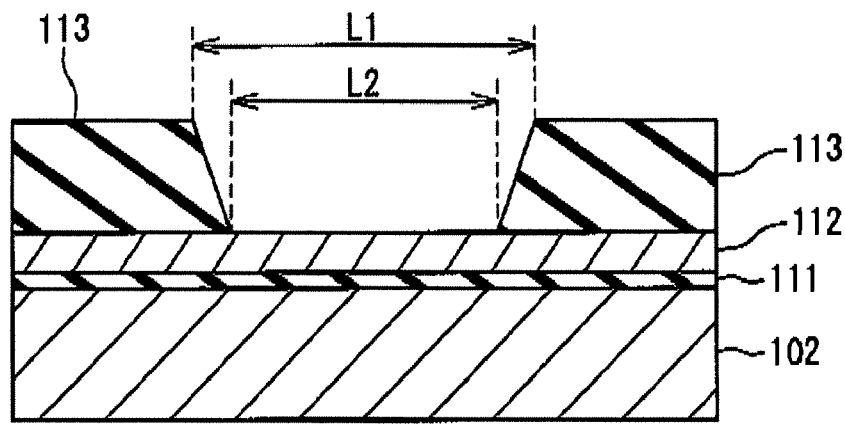
Figure 4C:
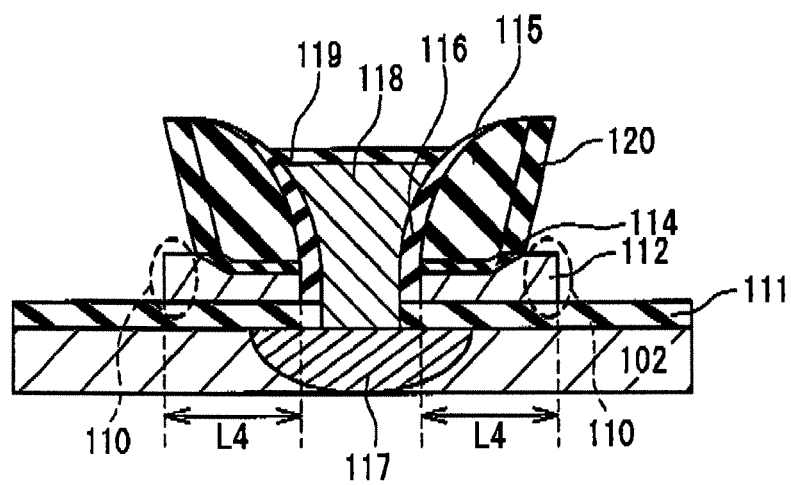
Figure 4D:
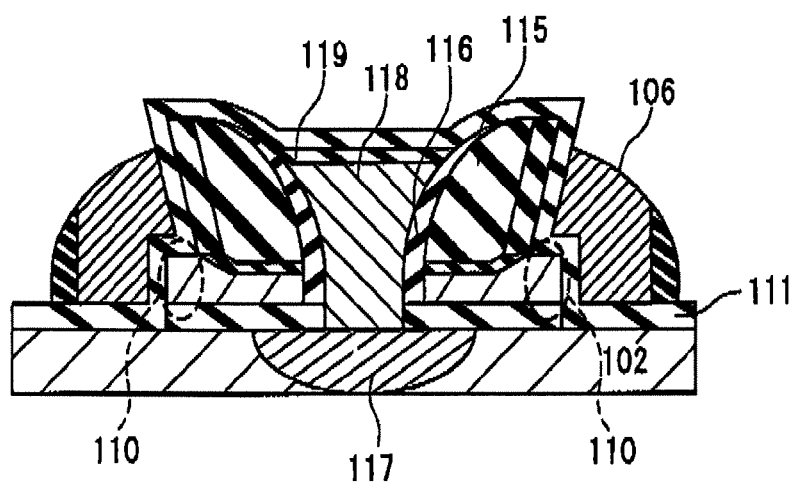

In the memory cell 1 of the split gate type non-volatile memory device in this embodiment, the acute angle portion 10 of the floating gate 5 can be formed properly and stably. Also, it is possible to suppress the variation in the gate length of the floating gate 5 that is caused by the variation in the manufacturing. Thus, it is possible to form the memory cell 1 of the split gate type non-volatile memory device in which the writing, reading and erasing operations shown in FIGS. 2A to 2C as mentioned above are properly executed.

The invention claimed is:

1. A method of manufacturing a split gate-type non-volatile semiconductor memory device which comprises a floating gate and a control gate, said method comprising:
    forming a polysilicon film for said floating gate over a substrate through a first insulating film;
    forming a second insulating film over said polysilicon film;
    forming a resist mask on said second insulating film;
    forming a first opening such that a lower portion of said first opening becomes narrower, by etching said second insulating film by using said resist mask;
    filling said first opening with a third insulating film;
    removing said second insulating film to form a second opening such that a lower portion of said second opening becomes wider;
    etching a portion of said polysilicon film exposed by said second opening to form an inclined portion;
    forming a fourth insulating film over said second opening and said third insulating film;
    etching back said fourth insulating film to form spacers with side walls inclined into a direction of a region where a source line is formed;
    removing said third insulating film to form a third opening;
    etching said polysilicon film in said third opening by using said spacers as a mask, to form said floating gate;
    exposing said substrate below said third opening;
    forming a fifth insulating film to cover said substrate, said floating gate and said side walls; and
    forming said control gate over said fifth insulating film.

2. The method according to claim 1, wherein said forming a first opening comprises:
    exposing said polysilicon film by forming said first opening,
    wherein said removing said second insulating film comprises:
    exposing said polysilicon film by forming said second opening.

3. The method according to claim 2, wherein said etching a portion of said polysilicon film exposed by said second opening comprises:
    forming said inclined portion such that a film thickness in a part of said polysilicon film close to a side of said third insulating film becomes gradually thicker than another part of said polysilicon film.

4. The method according to claim 3, wherein said etching said polysilicon film in said third opening comprises:
    removing said polysilicon film under said third opening by using said spacers, to form said floating gate with an acute-angled section.

5. The method according to claim 4, wherein said etching said polysilicon film in said third opening comprises:
    carrying out said etching with respect to a position in said inclined portion contacting with a side of said sidewalls, to form said acute-angled section.

6. The method according to claim 4, further comprising:
    further etching said polysilicon film to form a fourth opening;
    forming a sixth insulating film to cover a side of said further etched polysilicon film;
    etching back said sixth insulating film to form side spacers covering a side of said floating gate;
    forming a polysilicon plug in said fourth opening; and
    forming a seventh insulating film over said polysilicon plug.

7. The method according to claim 5, further comprising:
    further etching said polysilicon film to form a fourth opening;
    forming a sixth insulating film to cover a side of said further etched polysilicon film;
    etching back said sixth insulating film to form side spacers covering a side of said floating gate;
    forming a polysilicon plug in said fourth opening; and
    forming a seventh insulating film over said polysilicon plug.

* * * * *